(12) United States Patent
Hsu et al.

(10) Patent No.: US 9,658,709 B2
(45) Date of Patent: May 23, 2017

(54) TOUCH DISPLAY DEVICE

(71) Applicant: TPK Touch Solutions (Xiamen) Inc., Xiamen (CN)

(72) Inventors: I-Chung Hsu, Taipei (TW); Kuo-Shu Hsu, Xinbei (TW); Fenghua Lu, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 14/741,472

(22) Filed: Jun. 17, 2015

(65) Prior Publication Data

US 2015/0370395 A1 Dec. 24, 2015

(30) Foreign Application Priority Data

Jun. 19, 2014 (CN) .......................... 2014 1 0275345

(51) Int. Cl.
*G06F 3/044* (2006.01)
*G06F 3/041* (2006.01)

(52) U.S. Cl.
CPC ............ *G06F 3/0412* (2013.01); *G06F 3/044* (2013.01); *G06F 2203/04103* (2013.01); *H03K 2217/96031* (2013.01); *H03K 2217/960755* (2013.01)

(58) Field of Classification Search
None
See application file for complete search history.

(56) References Cited

U.S. PATENT DOCUMENTS

| | | | | |
|---|---|---|---|---|
| 2005/0083307 A1* | 4/2005 | Aufderheide | ........... | G06F 3/044 345/173 |
| 2011/0090170 A1* | 4/2011 | Lin | .......... | G06F 3/044 345/174 |
| 2013/0120283 A1* | 5/2013 | Tung | ........ | B32B 37/12 345/173 |
| 2013/0323521 A1* | 12/2013 | Xia | .......... | C09J 133/08 428/523 |

* cited by examiner

*Primary Examiner* — Seokyun Moon
(74) *Attorney, Agent, or Firm* — Cooper Legal Group, LLC (57) ABSTRACT

A touch display device comprises a touch panel, a display panel and a first transparent adhesive layer. The touch panel includes a first patterned electrode layer including a patterned portion and a non-patterned portion. The first transparent adhesive layer is disposed between the touch panel and the display panel. The refractive index of the first transparent adhesive layer is greater than or equal to 1.65 and less than or equal to 1.72, wherein reflectivity of the patterned portion is substantially the same as the reflectivity of the non-patterned portion.

16 Claims, 7 Drawing Sheets

TOUCH DISPLAY DEVICE

BACKGROUND OF THE DISCLOSURE

This Non-provisional application claims priority under 35 U.S.C. §119(a) to Chinese Patent Application No. 201410275345.8 filed in the People's Republic of China on Jun. 19, 2014, the entire contents of which are hereby incorporated by reference.

FIELD OF THE DISCLOSURE

This disclosure relates to touch technology, and more particularly, to a touch display device.

DESCRIPTION OF THE RELATED ART

As technology progresses, touch display devices are being applied in new products at a rapid clip. Current applications of the touch display device include portable electronic products (e.g., tablet computers, cell phones, and digital cameras), commercial products (e.g., automated teller machines, and remote video conferencing) and public information applications (e.g., airport kiosks, station guides, and data querying).

A touch display device includes a touch panel and a display panel which are attached to each other. The touch panel includes an electrode layer used for touch sensing. The electrode layer is usually a patterned electrode layer formed by etching a whole conductive layer. Because the electrode layer has a region with electrodes (i.e., the patterned portion) and another region without electrodes (i.e., the non-patterned portion) and these two regions have different refractive indexes, the electrode pattern may be visible, due to a larger difference of the reflectivity between the regions with and without electrodes, when external light is incident on the electrode layer and then reflected. Therefore, appearance of the touch display device is degraded.

SUMMARY OF THE DISCLOSURE

In view of the foregoing problem, the present disclosure provides a touch display device whereby the problem that the electrode pattern of the touch display device is visible and the technical complexity can be solved.

A touch display device according to the disclosure comprises a touch panel, a display panel and a first transparent adhesive layer. The touch panel includes a first patterned electrode layer including a patterned portion and a non-patterned portion. The first transparent adhesive layer is disposed between the touch panel and the display panel. The refractive index of the first transparent adhesive layer is greater than or equal to 1.65 and less than or equal to 1.72, wherein reflectivity of the patterned portion is substantially the same as reflectivity of the non-patterned portion.

In some embodiments, the first transparent adhesive layer has a first surface and a second surface which are disposed oppositely, the first surface faces the touch panel and the second surface faces the display panel, the refractive index of the first surface is greater than that of the second surface, and the stickiness of the second surface is greater than that of the first surface.

In some embodiments, the thickness of the first transparent adhesive layer is in a range between 150 µm and 200 µm.

In some embodiments, the touch panel includes a protection substrate, and the first patterned electrode layer is disposed on the protection substrate and between the protection substrate and the first transparent adhesive layer.

In some embodiments, the touch display device further comprises a refractive-index matching layer disposed between the protection substrate and the first patterned electrode layer.

In some embodiments, the refractive-index matching layer includes a first refractive-index matching layer and a second refractive-index matching layer, the first refractive-index matching layer is disposed between the protection substrate and the second refractive-index matching layer, the second refractive-index matching layer is disposed between the first patterned electrode layer and the first refractive-index matching layer, the refractive index of the first refractive-index matching layer is in a range between 2.0 and 2.5, and the refractive index of the second refractive-index matching layer is in a range between 1.3 and 1.6.

In some embodiments, the touch panel includes a protection substrate, a first transparent substrate and a second transparent adhesive layer. The first transparent substrate is disposed opposite the protection substrate. The first patterned electrode layer is disposed on the first transparent substrate and between the protection substrate and the first transparent substrate. The second transparent adhesive layer is disposed between the protection substrate and the first patterned electrode layer.

In some embodiments, the touch display device further comprises a second patterned electrode layer disposed on the side of the first transparent substrate away from the protection substrate.

In some embodiments, the touch display device further comprises a second patterned electrode layer disposed on the protection substrate and between the protection substrate and the second transparent adhesive layer.

In some embodiments, the touch display device further comprises a second transparent substrate, a second patterned electrode layer and a third transparent adhesive layer. The second patterned electrode layer is disposed on the second transparent substrate and between the first transparent substrate and the second transparent substrate. The third transparent adhesive layer is disposed between the first transparent substrate and the second patterned electrode layer.

In some embodiments, the first transparent substrate includes a glass substrate, a plastic substrate, a sapphire substrate, or a polyester thin film.

In some embodiments, the second transparent adhesive layer has a third surface and a fourth surface which are disposed oppositely, the third surface faces the protection substrate and the fourth surface faces the first transparent substrate, the refractive index of the fourth surface is greater than that of the third surface, and the stickiness of the third surface is greater than that of the fourth surface.

In some embodiments, the touch panel includes a protection substrate, a first transparent substrate and a second transparent adhesive layer. The first transparent substrate is disposed opposite the protection substrate. The first patterned electrode layer is disposed on the side of the first transparent substrate away from the protection substrate. The second transparent adhesive layer is disposed between the protection substrate and the first transparent substrate.

In some embodiments, the touch display device further comprises a refractive-index matching layer disposed between the first patterned electrode layer and the first transparent substrate.

In some embodiments, the refractive-index matching layer includes a first refractive-index matching layer and a second refractive-index matching layer, the first refractive-index matching layer is disposed between the first transparent substrate and the second refractive-index matching layer, the second refractive-index matching layer is disposed between the first patterned electrode layer and the first refractive-index matching layer, the refractive index of the first refractive-index matching layer is in a range between 2.0 and 2.5, and the refractive index of the second refractive-index matching layer is in a range between 1.3 and 1.6.

In some embodiments, the first transparent substrate and the first patterned electrode layer are formed on a carrying substrate and then transferred to the protection substrate.

In some embodiments, the thickness of the first transparent substrate is in a range between 0.1 µm and 15 µm.

As mentioned above, in the touch display device of this disclosure, the touch panel and the display panel are attached together by the first transparent adhesive layer of high refractive index. Accordingly, the first transparent adhesive layer not only provides the adhesion effect, but also makes the reflectivities of the patterned and non-patterned portions of the patterned electrode layer reach the same by its particular high refractive index, so that the electrode pattern of the touch display device is less visible or even invisible. Therefore, the appearance effect of the touch display device can be improved, and besides, the multi-layer optical film (or a plurality of optical films) of the conventional art can be reduced so that the touch display device can be made lighter and, thinner and the manufacturing method can be simplified.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

To be noted, the terms of "on" and "below" or "up" and "down" in the following illustration are just for showing the relative position of the elements. Besides, the case where a first element is formed on, above, over, below or under a second element can include the following meanings. That is, the first element can directly contact the second element, or an additional element is disposed between the first element and the second element, so that the first element and the second element are without the direct contact.

Figure 1A:
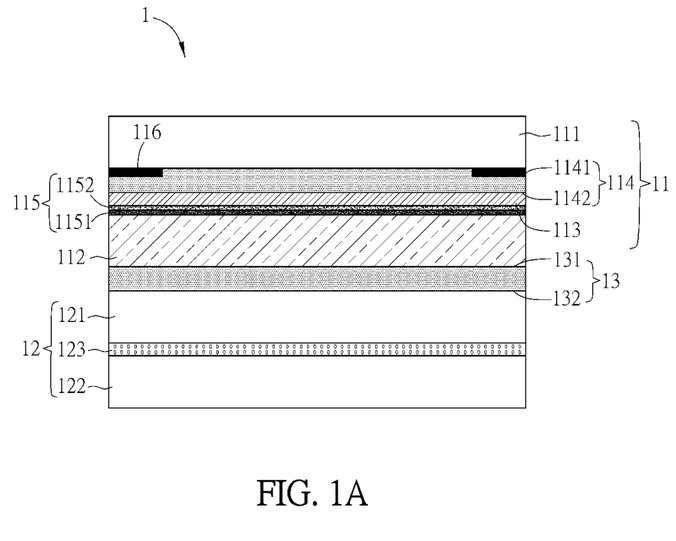
FIG. 1A is a schematic sectional diagram of a touch display device in accordance with one embodiment of the disclosure.

FIG. 1A is a schematic sectional diagram of a touch display device 1 in accordance with at least one embodiment of the disclosure. As shown in FIG. 1A, the touch display device 1 includes a touch panel 11, a display panel 12 and a first transparent adhesive layer 13. The first transparent adhesive layer 13 is disposed between the touch panel 11 and the display panel 12.

In some embodiments, the touch panel 11 includes a protection substrate 111, a first transparent substrate 112, a first patterned electrode layer 113 and a second transparent adhesive layer 114. The first transparent substrate 112 is disposed opposite the protection substrate 111. In some embodiments, the protection substrate 111 is a glass substrate, a plastic substrate or a sapphire substrate. The protection substrate 111 can also be a strengthened substrate where the six surfaces thereof are chemically strengthened, or only the upper and lower surfaces are chemically strengthened and the side surfaces are physically strengthened, in order to prevent the internal structure of the touch panel 11 from being damaged when the user presses the touch panel 11. In some embodiments, the first transparent substrate 112 also includes a glass substrate, a plastic substrate, a sapphire substrate, or even a polyester thin film, such as a PET film or a polyimide film, to carry the first patterned electrode layer 113. Herein, for example, the first transparent substrate 112 is a glass substrate, and the glass substrate can enhance overall structural strength of the touch panel 11.

In some embodiments, the first patterned electrode layer 113 is disposed on the first transparent substrate 112 and between the protection substrate 111 and the first transparent substrate 112. Herein for example, the first patterned electrode layer 113 is directly disposed on the first transparent substrate 112 and can be formed by exposure, development, etching or the like. Furthermore, the first patterned electrode layer 113 includes uniaxial touch electrodes (such as comb-shaped electrodes) or biaxial touch electrodes (such as two axial electrodes crossing each other), with biaxial electrodes illustrated here for example, but this disclosure is not limited thereto. The first patterned electrode layer 113 is, for example but not limited to, metal nanowire, transparent conductive film or metal mesh. For example, the metal nanowire is silver nanowire (SNW) or carbon nanotubes (CNT), and the transparent conductive film can be indium tin oxide (ITO), indium zinc oxide (IZO), fluorine doped tin oxide (FTO), aluminum doped zinc oxide (AZO) or gallium doped zinc oxide (GZO).

Figure 1B:
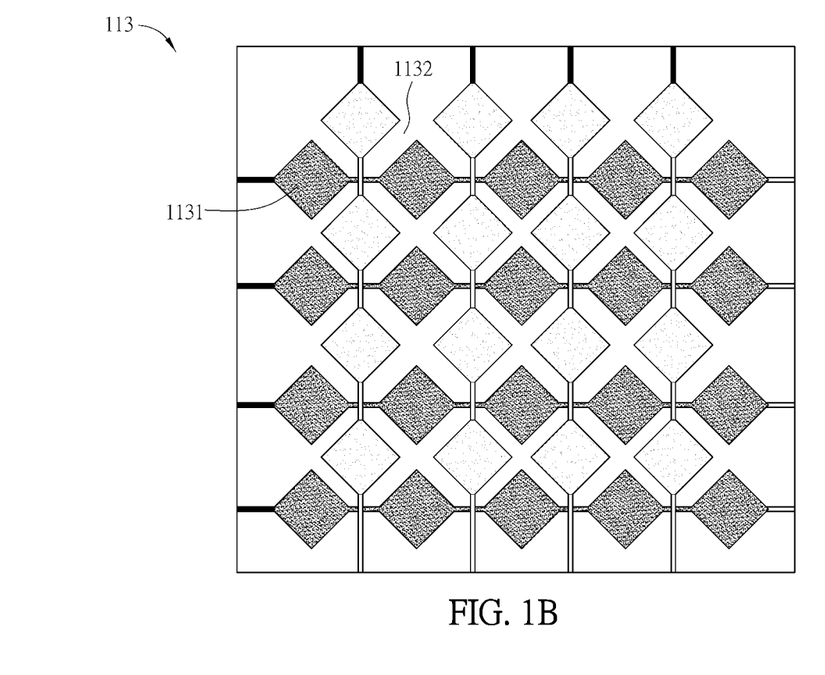
FIG. 1B is a schematic top view of the first patterned electrode layer in FIG. 1A.

FIG. 1B is a schematic top view of the first patterned electrode layer in FIG. 1A. As shown in FIG. 1A and FIG. 1B, the first patterned electrode layer 113 includes a patterned portion 1131 and a non-patterned portion 1132. The patterned portion 1131 is the portion of the above-mentioned touch electrodes, which is, for example, the combination of a plurality of blocks or strips, with blocks given as an example here. The non-patterned portion 1132 is the portion excluding the touch electrode, and mainly includes the region between the block-shaped touch electrodes. For configurations not including the first transparent adhesive layer 13, since the patterned portion 1131 has the conductive material with the refractive index mainly of the touch electrode, and the non-patterned portion 1132 is without the conductive material so as to have the refractive index of the first transparent substrate 112, the refractive indexes of the patterned portion 1131 and non-patterned portion 1132 are different. Accordingly, the patterned portion 1131 and the non-patterned portion 1132 differ significantly in reflectivity. The optical density of the patterned portion 1131 is higher, i.e. less pervious to light. The user will easily view the patterned portion 1131 of the first patterned electrode layer 113 when the external light reaches the first patterned electrode layer 113 through the protection substrate 111 and is then reflected to the outside through the first patterned electrode layer 113.

As shown in FIG. 1A, the display panel 12 includes a first substrate 121, a second substrate 122 and a display medium 123. The display medium 123 includes liquid crystal material or organic light emitting diode (OLED) material, such that the display panel 12 is a liquid crystal display (LCD) panel or an OLED panel. The first substrate 121 is a color filter (CF) substrate, a polarizer substrate, or a glass substrate, and the second substrate 122 is a thin film transistor (TFT) substrate to control the display medium 123 to display images. Herein, for example, the display panel 12 is an LCD panel, and the first substrate 121 is a CF substrate, the second substrate 122 is a TFT substrate, and the display medium 123 includes liquid crystal (LC) material.

As shown in FIG. 1A and FIG. 1B, the first transparent adhesive layer 113 is disposed between the touch panel 11 and the display panel 12 to connect the touch panel 11 and the display panel 12. The first transparent adhesive layer 113 is different from the normal optically clear adhesive (OCA), which has a refractive index similar to glass in a range between 1.48 and 1.5 and only functions for adhesion. However, the first transparent adhesive layer 113 of this disclosure, in comparison with the normal OCA, has a higher refractive index, which is greater than or equal to 1.65 and less than or equal to 1.72, wherein reflectivity of the patterned portion 1131 is substantially the same as the reflectivity of the non-patterned portion 1132. Favorably, the reflectivities of the patterned portion 1131 and non-patterned portion 1132 are identical or the same basically, so that the difference in reflectivity of visible light between the patterned portion 1131 and the non-patterned portion 1132 is reduced. Thereby, the visibility of the patterned portion 1131 can be effectively reduced, and the appearance of the touch display device can be improved.

Particularly, the first transparent adhesive layer 13 has a first surface 131 and a second surface 132 which are disposed oppositely. The first surface 131 faces the touch panel 11 and the second surface 132 faces the display panel 12. The refractive index of the first surface 131 is greater than that of the second surface 132, and the stickiness of the second surface 132 is greater than that of the first surface 131. In other words, the higher refractive index, which is greater than or equal to 1.65 and less than or equal to 1.72 and favorably 1.68 for the light of 550 nanometer wavelength, of the first surface 131 of the first transparent adhesive layer 13 reduces the visibility of the patterned portion 1131 of the first patterned electrode layer 113, and the higher stickiness of the second surface 132 aids connection of the touch panel 11 to the display panel 12. The thickness of the first transparent adhesive layer 13 is in a range between 150 μm and 200 μm, and thereby, the disposition of the first transparent adhesive layer 13 between the touch panel 11 and the display panel 12 both connects the touch panel 11 to the display panel 12, and reduces the visibility of the patterned portion 1131.

The second transparent adhesive layer 114 is disposed between the protection substrate 111 and the first patterned electrode layer 113 to connect the protection substrate 111 to the first transparent substrate 112. The second transparent adhesive layer 114 is a transparent optical adhesive, such as OCA, mainly for the connection of the protection substrate 111 and first transparent substrate 112.

In some embodiments, the second transparent adhesive layer 114 uses the same material as the first transparent adhesive layer 13, and the refractive index thereof is greater than or equal to 1.65 and less than or equal to 1.72 to further reduce the difference of the reflectivity between the patterned portion 1131 and the non-patterned portion 1132.

Particularly, the second transparent adhesive layer 114 has a third surface 1141 and a fourth surface 1142 which are disposed oppositely. The third surface 1141 faces the protection substrate 111 and the fourth surface 1142 faces the first transparent substrate 112. The refractive index of the fourth surface 1142 is greater than that of the third surface 1141, and the stickiness of the third surface 1141 is greater than that of the fourth surface 1142. In other words, the higher refractive index of the fourth surface 1142 of the second transparent adhesive layer 14 reduces the visibility of the patterned portion 1131 of the first patterned electrode layer 113, and the higher stickiness of the third surface 1141 aids connection of the protection substrate 111 to the first transparent substrate 112. The thickness of the second transparent adhesive layer 114 is also in the range between 150 μm and 200 μm, and thereby, the disposition of the second transparent adhesive layer 114 between the protection substrate 111 and the first transparent substrate 112 can both connect the protection substrate 111 to the first transparent substrate 112 and reduce the visibility of the patterned portion 1131.

In some embodiments, the touch panel 11 further includes a refractive-index matching layer 115, which is disposed between the first patterned electrode layer 113 and the first transparent substrate 112, and can be a single-layer or multi-layer structure. The refractive index and thickness of the refractive-index matching layer 115 are adjusted according to the refractive index (N value) and extinction coefficient (K value) of the first patterned electrode layer 113 and the refractive index and thickness of the second transparent adhesive layer 114, so as to further reduce the visibility of the patterned portion 1131. For example, the refractive index of the patterned portion 1131 of the first patterned electrode layer 113 is in a range between 1.48 and 2.03, the extinction coefficient of the patterned portion 1131 of the first patterned electrode layer 113 is in a range between 0.006 and 0.55, the refractive index of the second transparent adhesive layer 114 is in a range between 1.65 and 1.72, and the thickness of the second transparent adhesive layer 114 is in a range between 150 μm and 200 μm. In some embodiments, the refractive-index matching layer 115 includes a first refractive-index matching layer 1151 and a second refractive-index matching layer 1152. The first refractive-index matching layer 1151 is disposed between the first transparent substrate 112 and the second refractive-index matching layer 1152, and the second refractive-index matching layer 1152 is disposed between the first patterned electrode layer 113 and the first refractive-index matching layer 1151. The material of the first refractive-index matching layer 1151 is, for example but not limited to, $Nb_2O_5$, and the material of the second refractive-index matching layer 1152 is, for example but not limited to, $SiO_2$. The thickness of the first refractive-index matching layer 1151 is in a range between 4 nm and 20 nm, and the refractive index thereof is in a range between 2.0 and 2.5. The thickness of the second refractive-index matching layer 1152 is in a range between 20 nm and 60 nm, and the refractive index thereof is in a range between 1.3 and 1.6. Thereby, the refractive-index matching layer 115, the first patterned electrode layer 113 and the second transparent adhesive layer 114 can be used for matching the refractive index, and also the difference of the reflectivities between the patterned portion 1131 and non-patterned portion 1132 of the first patterned electrode layer 113 can be minimized, so as to reduce the visibility of the patterned portion 1131.

In some embodiments, the touch panel 11 further includes a covering layer 116 which is disposed on the side of the protection substrate 111 facing the first transparent substrate 112. In some embodiments, the covering layer 116 is disposed on the side of the protection substrate 11 away from the first transparent substrate 112. Furthermore, the covering layer 116 is located in the peripheral region of the protection substrate 111 to cover the wires (not shown) connecting the first patterned electrode layer 113 with the external circuit, or cover the circuit board (not shown), or cover other electronic elements. Herein for example, the covering layer 116 includes the light-blocking material of higher optical density, such as ink, photoresist material or their combination.

Figure 2:
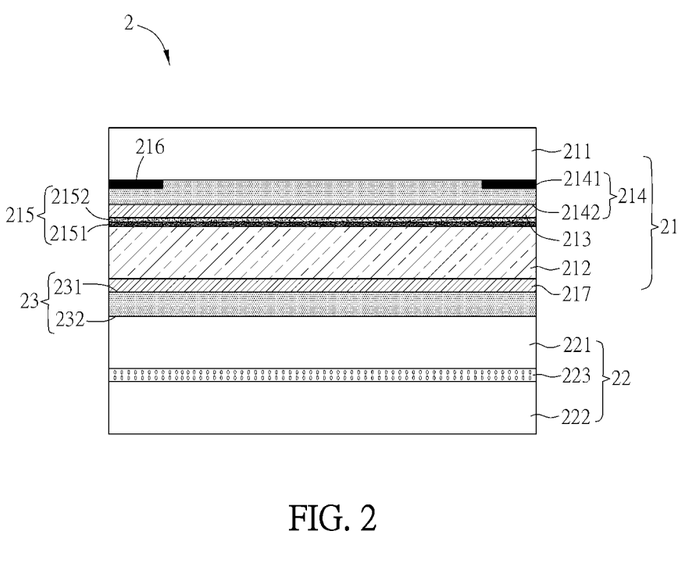
FIG. 2 is a schematic sectional diagram of a touch display device in accordance with one embodiment of the disclosure.

FIG. 2 is a schematic sectional diagram of a touch display device 2 in accordance with various embodiments of the disclosure. As shown in FIG. 2, the touch display device 2 includes a touch panel 21, a display panel 22 and a first transparent adhesive layer 23. The first transparent adhesive layer 23 is disposed between the touch panel 21 and the display panel 22. The touch panel 21 includes a protection substrate 211, a first transparent substrate 212, a first patterned electrode layer 213, a second transparent adhesive layer 214, a refractive-index matching layer 215 and a covering layer 216. In some embodiments, the touch panel 21 further includes a second patterned electrode layer 217 disposed on the side of the first transparent substrate 212 away from the protection substrate 211, i.e. the side different from the first patterned electrode layer 213.

In some embodiments, the first patterned electrode layer 213 includes touch electrodes along the first axial direction, and the second patterned electrode layer 217 includes touch electrodes along the second axial direction which crosses the first axial direction, for example, perpendicularly. The first patterned electrode layer 213 and the second patterned electrode layer 217 are both transparent conductive films of ITO, and that is, the touch panel 21 is a double ITO (DITO) touch panel. Of course, the ITO also can be replaced by IZO, FTO, AZO or GZO for example. Likewise, the first patterned electrode layer 213 and the second patterned electrode layer 217 also can be embodied as metal nanowire or metal mesh.

The display panel 22 includes a first substrate 221, a second substrate 222 and a display medium 223. The first transparent adhesive layer 23 includes a first surface 231 and a second surface 232 opposite the first surface 231. The illustration of the display panel 22 and first transparent adhesive layer 23 can be comprehended by referring to the description of FIG. 1A and FIG. 1B, and is thus omitted here for conciseness.

In some embodiments, the refractive-index matching layer 215 is disposed between the first patterned electrode layer 213 and the first transparent substrate 212, and includes a first refractive-index matching layer 2151 and a second refractive-index matching layer 2152. The first-refractive-index matching layer 2151 is disposed between the first transparent substrate 212 and the second refractive-index matching layer 2152, and the second refractive-index matching layer 2152 is disposed between the first patterned electrode layer 213 and the first refractive-index matching layer 2151. The refractive-index matching layer 215, the first transparent adhesive layer 23, the first patterned electrode layer 213, the second patterned electrode layer 217 and the second transparent adhesive layer 214 are used for matching the refractive index, and the refractive index and thickness of the refractive-index matching layer 215 are adjusted to achieve the purpose of matching the refractive index so as to further reduce the visibility of the patterned portion. Moreover, the illustration of the refractive-index matching layer 215 can be comprehended by referring to the above description, and is therefore omitted here for conciseness.

In other embodiments, the refractive-index matching layer 215 is disposed between the first transparent substrate 212 and the second patterned electrode layer 217. Besides, the first refractive-index matching layer 2151 is disposed between the first transparent substrate 212 and the second refractive-index matching layer 2152, and the second refractive-index matching layer 2152 is disposed between the second patterned electrode layer 217 and the first refractive-index matching layer 2151, in consideration of further reducing the visibility of the patterned portion.

Likewise, the second transparent adhesive layer 214 has a third surface 2141 and a fourth surface 2142 which are disposed oppositely. The third surface 2141 faces the protection substrate 211 and the fourth surface 2142 faces the first transparent substrate 212. The refractive index of the fourth surface 2142 is greater than that of the third surface 2141, and the stickiness of the third surface 2141 is greater than that of the fourth surface 2142. In other words, the higher refractive index of the fourth surface 2142 of the second transparent adhesive layer 214 can help reduce the visibility of the patterned portion (referring to the patterned portion 1131 in FIG. 1B) of the first patterned electrode layer 213 and second patterned electrode layer 217, and the higher stickiness of the third surface 2141 can help the connection of the protection substrate 211 and first transparent substrate 212. The refractive index and features of the second transparent adhesive layer 214 can be comprehended by referring to the above description and the related illustration is thus omitted here for conciseness.

Moreover, the illustration of the first transparent adhesive layer 23, protection substrate 211, first transparent substrate 212 and covering layer 216 can be comprehended by referring to the above description, and therefore is omitted here for conciseness.

Figure 3:
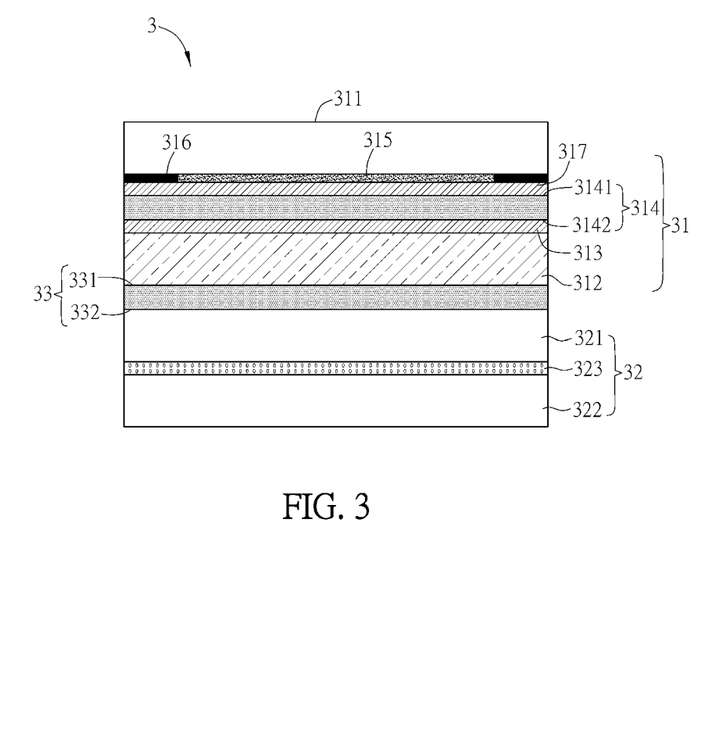
FIG. 3 is a schematic sectional diagram of a touch display device in accordance with one embodiment of the disclosure.

FIG. 3 is a schematic sectional diagram of a touch display device 3 in accordance with various embodiments of the disclosure. As shown in FIG. 3, the touch display device 3 includes a touch panel 31, a display panel 32 and a first transparent adhesive layer 33. The first transparent adhesive layer 33 is disposed between the touch panel 31 and the display panel 32. The touch panel 31 includes a protection substrate 311, a first transparent substrate 312, a first patterned electrode layer 313, a second transparent adhesive layer 314, a refractive-index matching layer 315, a covering layer 316 and a second patterned electrode layer 317. The second patterned electrode layer 317 of the touch panel 31 is disposed on the protection substrate 311 and between the protection substrate 311 and the first transparent substrate 312.

Likewise, the first patterned electrode layer 313 includes touch electrodes along the first axial direction, and the second patterned electrode layer 317 includes touch electrodes of along second axial direction which crosses the first axial direction, for example, perpendicularly. The first patterned electrode layer 313 and the second patterned electrode layer 317 are embodied as the metal nanowire, transparent conductive film or metal mesh, but however, this disclosure is not limited thereto. The related illustration can be comprehended by referring to the above description and is thus omitted here for conciseness.

The display panel 32 includes the first substrate 321, the second substrate 322 and the display medium 323. The first transparent adhesive layer 33 includes a first surface 331 and a second surface 332 opposite the first surface 331. The illustration of the display panel 32 and first transparent adhesive layer 33 can be comprehended by referring to the first embodiment and is thus omitted here for conciseness.

In some embodiments, the refractive-index matching layer 315, the first transparent adhesive layer 33, the first patterned electrode layer 313, the second patterned electrode layer 317 and the second transparent adhesive layer 314 are used for matching the refractive index, and the refractive index and thickness of the refractive-index matching layer 315 are adjusted to achieve the purpose of matching the refractive index. Herein for example, the refractive-index matching layer 315 is disposed between the first transparent substrate 312 and the first patterned electrode layer 313 or between the protection substrate 311 and the second patterned electrode layer 317 as shown in FIG. 3.

Likewise, the second transparent adhesive layer 314 has a third surface 3141 and a fourth surface 3142 which are disposed oppositely. The third surface 3141 faces the protection substrate 311 and the fourth surface 3142 faces the first transparent substrate 312. The refractive index of the fourth surface 3142 is greater than that of the third surface 3141, and the stickiness of the third surface 3141 is greater than that of the fourth surface 3142. In other words, the higher refractive index of the fourth surface 3142 of the second transparent adhesive layer 314 can help reducing the visibility of the patterned portion (referring to the patterned portion 1131 in FIG. 1B) of the first patterned electrode layer 313 and second patterned electrode layer 317, and the higher stickiness of the third surface 3141 can help the connection of the protection substrate 311 and first transparent substrate 312. The refractive index and features of the second transparent adhesive layer 314 can be comprehended by referring to the above description, and the related illustration is thus omitted here for conciseness.

Moreover, the illustration of the first transparent adhesive layer 33, protection substrate 311, first transparent substrate 312 and covering layer 316 can be comprehended by referring to the above description, and therefore is omitted here for conciseness.

Figure 4:
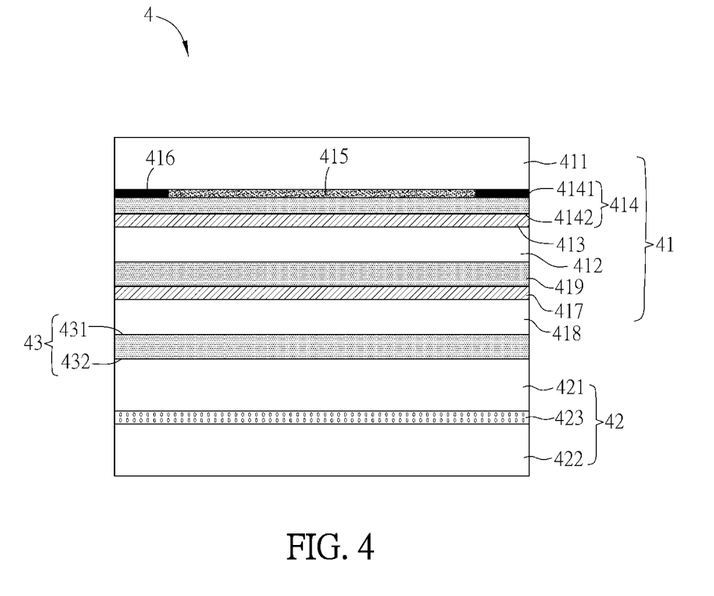
FIG. 4 is a schematic sectional diagram of a touch display device of in accordance with one embodiment of the disclosure.

FIG. 4 is a schematic sectional diagram of a touch display device 4 in accordance with various embodiments of the disclosure. As shown in FIG. 4, the touch display device 4 includes a touch panel 41, a display panel 42 and a first transparent adhesive layer 43. The first transparent adhesive layer 43 is disposed between the touch panel 41 and the display panel 42. The touch panel 41 includes a protection substrate 411, a first transparent substrate 412, a first patterned electrode layer 413, a second transparent adhesive layer 414, a refractive-index matching layer 415 and a covering layer 416. The touch panel 41 further includes a second patterned electrode layer 417, a second transparent substrate 418 and a third transparent adhesive layer 419. The second patterned electrode layer 417 is disposed on the second transparent substrate 418 and between the first transparent substrate 412 and the second transparent substrate 418. Moreover, the first transparent substrate 412 and the second transparent substrate 418 of this embodiment are both polyester thin films.

Furthermore, the touch panel 41 is a cover glass/sensor film X/sensor film Y (GFF) touch panel. In the manufacturing process, the first patterned electrode layer 413 is formed on the first transparent substrate 412 and the second patterned electrode layer 417 is formed on the second transparent substrate 418, and then the first transparent substrate 412 and the second transparent substrate 418 are connected to each other by the third transparent adhesive layer 419. Then, the protection substrate 411, the first transparent substrate 412 and the second transparent substrate 418 are connected together by the second transparent adhesive layer 414 to form the touch panel 41, and lastly, the touch panel 41 and the display panel 42 are connected to each other by the first transparent adhesive layer 43. The third transparent adhesive layer 419 and the second transparent adhesive layer 414 in an embodiment have the same material, and the related illustration can be comprehended by referring to the above description, and is thus omitted here for conciseness. Of course, the third transparent adhesive layer 419 also can be a normal OCA for the connection only.

The display panel 42 includes the first substrate 421, the second substrate 422 and the display medium 423. The first transparent adhesive layer 43 includes a first surface 431 and a second surface 432 opposite the first surface 431. The illustration of the display panel 42 and first transparent adhesive layer 43 can be comprehended by referring to the above description, and is thus omitted here for conciseness.

Likewise, the first patterned electrode layer 413 includes the touch electrodes of the first axial direction, and the second patterned electrode layer 417 includes the touch electrodes of the second axial direction which crosses the first axial direction, for example, perpendicularly.

In some embodiments, the refractive-index matching layer 415, the first transparent adhesive layer 43, the first patterned electrode layer 413, the second patterned electrode layer 417, the second transparent adhesive layer 414 and the third transparent adhesive layer 419 are used for matching the refractive index, and the refractive index and thickness of the refractive-index matching layer 415 are adjusted to achieve the purpose of matching the refractive index.

Likewise, the second transparent adhesive layer 414 has a third surface 4141 and a fourth surface 4142 which are disposed oppositely. The third surface 4141 faces the protection substrate 411 and the fourth surface 4142 faces the first transparent substrate 412. The refractive index of the fourth surface 4142 is greater than that of the third surface 4141, and the stickiness of the third surface 4141 is greater than that of the fourth surface 4142. In other words, the higher refractive index of the fourth surface 4142 of the second transparent adhesive layer 414 can help reducing the visibility of the patterned portion (referring to the patterned portion 1131 in FIG. 1B) of the first patterned electrode layer 413 and second patterned electrode layer 417, and the higher stickiness of the third surface 4141 can help the connection of the protection substrate 411 and first transparent substrate 412. The refractive index and features of the second transparent adhesive layer 414 can be comprehended by referring to the above description, and the related illustration is thus omitted here for conciseness.

Moreover, the illustration of the first transparent adhesive layer 43, protection substrate 411, first transparent substrate 412 and covering layer 416 can be comprehended by referring to the above disclosure, and therefore is omitted here for conciseness.

Figure 5:
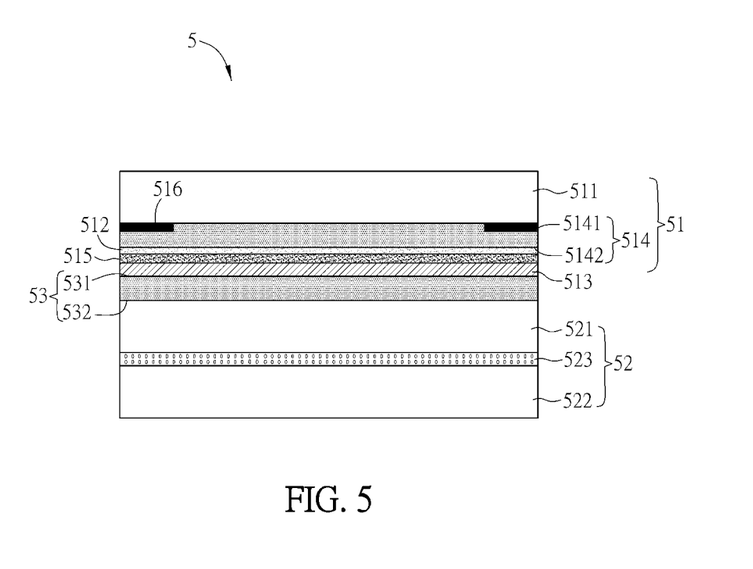
FIG. 5 is a schematic sectional diagram of a touch display device in accordance with one embodiment of the disclosure.

FIG. 5 is a schematic sectional diagram of a touch display device 5 in accordance with various embodiments of the disclosure. As shown in FIG. 5, the touch display device 5 includes a touch panel 51, a display panel 52 and a first transparent adhesive layer 53. The first transparent adhesive layer 53 is disposed between the touch panel 51 and the display panel 52. The touch panel 51 includes a protection substrate 511, a first transparent substrate 512, a first patterned electrode layer 513 and a second transparent adhesive layer 514. The first transparent substrate 512 and the protection substrate 511 are disposed oppositely. The first patterned electrode layer 513 is disposed on the side of the transparent substrate 512 away from the protection substrate 511. The second transparent adhesive layer 514 is disposed between the protection substrate 511 and the first transparent substrate 512 to attach the first transparent substrate 512 with the first patterned electrode layer 513 to the protection substrate 511.

The display panel 52 includes a first substrate 521, a second substrate 522 and a display medium 523. The first transparent adhesive layer 53 includes a first surface 531 and a second surface 532 opposite the first surface 531. The illustration of the display panel 52 and first transparent adhesive layer 53 can be comprehended by referring to the first embodiment and is thus omitted here for conciseness.

In some embodiments, the second transparent adhesive layer 514 is a transparent optical adhesive, such as OCA, mainly for the connection of the protection substrate 511 and first transparent substrate 512. In some embodiments, the second transparent adhesive layer 514 uses the same material as the first transparent adhesive layer 53. Herein for example, the third surface 5141 of the second transparent adhesive layer 514 faces the protection substrate 511 and the fourth surface 5142 thereof faces the first transparent substrate 512. Likewise, the refractive, index of the fourth surface 5142 is greater than that of the third surface 5141, and the stickiness of the fourth surface 5142 is greater than that of the third surface 5141. Accordingly, by the second transparent adhesive layer 514 disposed between the protection substrate 511 and the first transparent substrate 512, the connection of the protection substrate 511 and first transparent substrate 512 and the reduction of the visibility of the patterned portion (referring to the patterned portion 1131 in FIG. 1B) can be both achieved. The refractive index and features of the second transparent adhesive layer 514 can be comprehended by referring to the above description, and the related illustration is thus omitted here for conciseness.

Physically, the first patterned electrode layer 513 and the first transparent substrate 512 can be formed on the protection substrate 511 by a film transfer process, and the method thereof includes, for example, the following steps of: providing a carrying substrate (not shown); forming the first transparent substrate 512 such as a polyimide film on the carrying substrate, and then forming the first patterned electrode layer 513 on the first transparent substrate 512 which is disposed between the carrying substrate and the first patterned electrode layer 513; forming a transfer layer (not shown) such as a single-sided adhesive on the first patterned electrode layer 513; removing the carrying substrate; and attaching the first patterned electrode layer 513, the transparent substrate 512 and the transfer layer to the protection substrate 511 by the second transparent adhesive layer 514, wherein the first transparent substrate 512 and the first patterned electrode layer 513 are disposed between the second transparent adhesive layer 514 and the transfer layer; and removing the transfer layer. Accordingly, the first patterned electrode layer 513 and the first transparent substrate 512 are formed on the protection substrate 511 by the second transparent adhesive layer 514. To be noted, in at least one embodiment, for the case of the first patterned electrode layer 513 and first transparent substrate 512 attached to the protection substrate 511, a side of the first transparent substrate 512 is attached to the protection substrate 511, so that the first transparent substrate 512 is disposed between the first patterned electrode layer 513 and the second transparent adhesive layer 514.

In some embodiments, the material of the first transparent substrate 512 is polyimide favorably, and is formed by solidification following solution coating or by other proper methods. Besides, the thickness of the first transparent substrate 512 is very thin in relation to the common glass substrate, and can be about in a range between 0.1 μm and 15 μm or favorably between 2 μm and 5 μm.

Accordingly, the first patterned electrode layer 513 and the first transparent substrate 512 are formed on the protection substrate 511 by the above-mentioned film transfer process. Besides, the first transparent substrate 512 is very thin, and furthermore, the first patterned electrode layer 513 is formed on the first transparent substrate 512 by the support effect of the carrying substrate, then the carrying substrate is removed, and then the first transparent substrate 512 and the first patterned electrode layer 513 are attached to the protection substrate 511 by the transfer effect of the transfer layer. Thereby, the entire thickness of the touch panel is reduced.

The touch panel 51 of the touch display device 5 further includes the refractive-index matching layer 515 disposed between the first transparent substrate 512 and the first patterned electrode layer 513. The material and features of the refractive-index matching layer 515 can be comprehended by referring to the first embodiment. Moreover, the refractive-index matching layer 515, the first transparent adhesive layer 53 and the first patterned electrode layer 513 are used for matching the refractive index, and the refractive index and thickness of the refractive-index matching layer 515 are adjusted to achieve the effect of further reducing the visibility of the patterned portion of the first patterned electrode layer 513.

In some embodiments, the touch panel 51 of the touch display device 5 also includes the covering layer 516 disposed on the side of the protection substrate 511 facing the first transparent substrate 512. Moreover, the covering layer 516 is disposed in the peripheral region of the protection substrate 511 to cover the wires (not shown) connecting the first patterned electrode layer 513, or cover the circuit board (not shown), or cover other electronic elements. Herein for example, the covering layer 516 includes the light-blocking material of higher optical density, such as ink, photoresist material or their combination.

Figure 6:
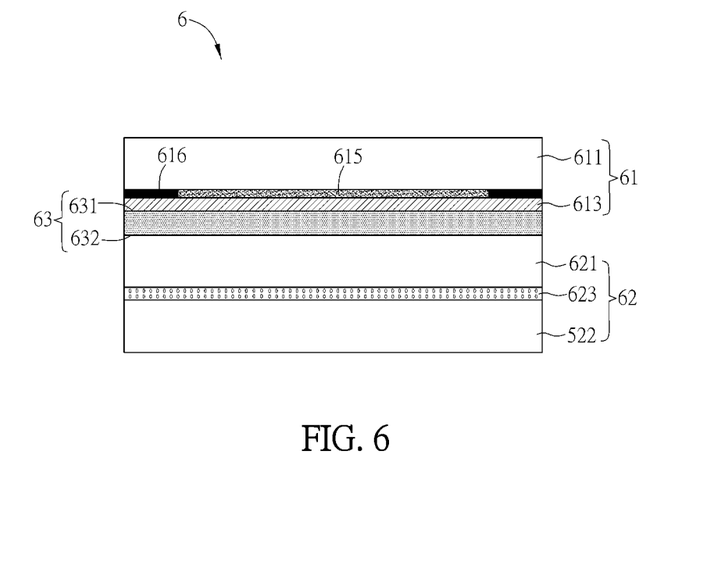
FIG. 6 is a schematic sectional diagram of a touch display device in accordance with one embodiment of the disclosure.

FIG. 6 is a schematic sectional diagram of a touch display device 6 in accordance with various embodiments of the disclosure. As shown in FIG. 6, the touch display device 6 includes a touch panel 61, a display panel 62 and a first transparent adhesive layer 63. The first transparent adhesive layer 63 is disposed between the touch panel 61 and the display panel 62. In some embodiments, the touch panel 61 includes a protection substrate 611, a first patterned electrode layer 613, a refractive-index matching layer 615 and a covering layer 616. The first patterned electrode layer 613 is disposed on the protection substrate 611 and between the protection substrate 611 and the first transparent adhesive layer 63. In other words, the touch panel 61 is made by the one glass solution (OGS) touch technology, wherein the first patterned electrode layer 613 is disposed on the protection substrate 611 to integrate the substrate carrying the touch structure with the protection substrate 611 so as to decrease the substrate usage and achieve the lightness and thinness of the touch display panel.

The display panel 62 includes a first substrate 621, a second substrate 622 and a display medium 623. The first transparent adhesive layer 63 includes a first surface 631 and a second surface 632 opposite the first surface 631. The illustration of the display panel 62 and first transparent adhesive layer 63 can be comprehended by referring to the above description and is thus omitted here for conciseness.

In some embodiments, the refractive-index matching layer 615 is disposed between the protection substrate 611 and the first patterned electrode layer 613. In the manufacturing process, the refractive-index matching layer 615 is formed on the protection substrate 611 firstly, and then the first patterned electrode layer 613 is formed on the protection substrate 611 to cover the refractive-index matching layer 615. The material and features of the refractive-index matching layer 615 can be comprehended by referring to the first embodiment. Moreover, the refractive-index matching layer 615, the first transparent adhesive layer 63 and the first patterned electrode layer 613 are used for matching the refractive index, and the refractive index and thickness of the refractive-index matching layer 615 are adjusted to achieve the effect of further reducing the visibility of the patterned portion of the first patterned electrode layer 613.

The covering layer 616 is disposed on the side of the protection substrate 611 facing the display panel 62. Moreover, the covering layer 616 is also disposed in the peripheral region of the protection substrate 611 to cover the wires (not shown) connecting the first patterned electrode layer 613, or cover the circuit board (not shown), or cover other electronic elements. Herein for example, the covering layer 616 includes the light-blocking material of higher optical density, such as ink, photoresist material or their combination. To be noted, in the peripheral region, the covering layer 616 is disposed between the first patterned electrode layer 613 and the protection substrate 611, and correspondingly, the refractive-index matching layer 615 is only disposed in the middle region of the touch panel 61. In some embodiments, the refractive-index matching layer 615 may be extended to cover the covering layer 616 so that the covering layer 616 in the peripheral region can be disposed between the protection substrate 611 and the refractive-index matching layer 615, or the refractive-index matching layer 615 in the peripheral region is disposed between the covering layer 616 and the protection substrate 611.

Summarily, in the touch display device of this disclosure, the touch panel and the display panel are attached together by the first transparent adhesive layer of high refractive index. Accordingly, the first transparent adhesive layer not only can provide the adhesion effect, but also can make the reflectivities of the patterned and non-patterned portions of the patterned electrode layer reach the same by its particular high refractive index, so that the electrode pattern of the touch display device is less visible or even invisible. Therefore, the appearance effect of the touch display device can be improved, and besides, the multi-layer optical film (or a plurality of optical films) of the conventional art can be reduced so that the touch display device can be made lighter and thinner and the manufacturing method can be simplified.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A touch display device, comprising:
   a touch panel comprising a protection substrate and a first patterned electrode layer comprising a patterned portion and a non-patterned portion;
   a display panel;
   a first transparent adhesive layer disposed between the touch panel and the display panel, wherein:
      a refractive index of the first transparent adhesive layer is greater than or equal to 1.65 and less than or equal to 1.72,
      reflectivity of the patterned portion is substantially the same as reflectivity of the non-patterned portion, and
      the first patterned electrode layer is disposed on the protection substrate and between the protection substrate and the first transparent adhesive layer; and
   a refractive-index matching layer disposed between the protection substrate and the first patterned electrode layer, wherein:
      the refractive-index matching layer comprises a first refractive-index matching layer and a second refractive-index matching layer,
      the first refractive-index matching layer is disposed between the protection substrate and the second refractive-index matching layer,
      the second refractive-index matching layer is disposed between the first patterned electrode layer and the first refractive-index matching layer,
      a refractive index of the first refractive-index matching layer is in a range between 2.0 and 2.5, and
      a refractive index of the second refractive-index matching layer is in a range between 1.3 and 1.6.

2. The touch display device of claim 1, wherein:
   the first transparent adhesive layer has a first surface and a second surface which are disposed oppositely,
   the first surface faces the touch panel and the second surface faces the display panel,
   a refractive index of the first surface is greater than a refractive index of the second surface, and
   a stickiness of the second surface is greater than a stickiness of the first surface.

3. The touch display device of claim 2, wherein a thickness of the first transparent adhesive layer is in a range between 150 μm and 200 μm.

4. The touch display device of claim 1, wherein the touch panel comprises:
   a first transparent substrate; and
   a second transparent adhesive layer disposed between the protection substrate and the first patterned electrode layer.

5. The touch display device of claim 4, further comprising:
   a second patterned electrode layer disposed on a side of the first transparent substrate away from the protection substrate.

6. The touch display device of claim 4, further comprising:
   a second patterned electrode layer disposed on the protection substrate and between the protection substrate and the second transparent adhesive layer.

7. The touch display device of claim 4, further comprising:
   a second transparent substrate;

a second patterned electrode layer disposed on the second transparent substrate and between the first transparent substrate and the second transparent substrate; and a third transparent adhesive layer disposed between the first transparent substrate and the second patterned electrode layer.

8. The touch display device of claim 4, wherein the first transparent substrate comprises a glass substrate, a plastic substrate, a sapphire substrate, or a polyester thin film.

9. The touch display device of claim 4, wherein the first transparent substrate and the first patterned electrode layer are formed on a carrying substrate and then transferred to the protection substrate.

10. The touch display device of claim 1, wherein the touch panel comprises:

a first transparent substrate; and a second transparent adhesive layer disposed between the protection substrate and the first transparent substrate.

11. The touch display device of claim 10, wherein the first transparent substrate and the first patterned electrode layer are formed on a carrying substrate and then transferred to the protection substrate.

12. The touch display device of claim 10, wherein a thickness of the first transparent substrate is in a range between 0.1 μm and 15 μm.

13. A touch display device, comprising:

a touch panel comprising a protection substrate, a first transparent substrate, a first patterned electrode layer comprising a patterned portion and a non-patterned portion, and a second transparent adhesive layer disposed between the protection substrate and the first patterned electrode layer, wherein the first patterned electrode layer is disposed on the first transparent substrate and between the protection substrate and the first transparent substrate;

a display panel; and a first transparent adhesive layer disposed between the touch panel and the display panel, wherein:

a refractive index of the first transparent adhesive layer is greater than or equal to 1.65 and less than or equal to 1.72, reflectivity of the patterned portion is substantially the same as reflectivity of the non-patterned portion, the second transparent adhesive layer has a third surface and a fourth surface which are disposed oppositely, the third surface faces the protection substrate and the fourth surface faces the first transparent substrate, a refractive index of the fourth surface is greater than a refractive index of the third surface, and a stickiness of the third surface is greater than a stickiness of the fourth surface.

14. A touch display device, comprising:

a touch panel comprising a protection substrate, a first transparent substrate, a first patterned electrode layer comprising a patterned portion and a non-patterned portion, and a second transparent adhesive layer disposed between the protection substrate and the first patterned electrode layer;

a display panel;

a first transparent adhesive layer disposed between the touch panel and the display panel, wherein:

a refractive index of the first transparent adhesive layer is greater than or equal to 1.65 and less than or equal to 1.72, and reflectivity of the patterned portion is substantially the same as reflectivity of the non-patterned portion; and a refractive-index matching layer disposed between the first patterned electrode layer and the first transparent substrate, wherein:

the refractive-index matching layer comprises a first refractive-index matching layer and a second refractive-index matching layer, the first refractive-index matching layer is disposed between the first transparent substrate and the second refractive-index matching layer, the second refractive-index matching layer is disposed between the first patterned electrode layer and the first refractive-index matching layer, a refractive index of the first refractive-index matching layer is in a range between 2.0 and 2.5, and a refractive index of the second refractive-index matching layer is in a range between 1.3 and 1.6.

15. The touch display device of claim 14, wherein the first patterned electrode layer is disposed on the first transparent substrate and between the protection substrate and the first transparent substrate.

16. The touch display device of claim 14, wherein the first patterned electrode layer is disposed on a side of the first transparent substrate away from the protection substrate.

* * * * *